United States Patent [19]

Carlston

[11] 3,969,182
[45] July 13, 1976

[54] GROWTH OF MERCURIC IODIDE SINGLE CRYSTALS FROM DIMETHYLSULFOXIDE

[75] Inventor: Richard C. Carlston, San Luis Obispo, Calif.

[73] Assignee: The United States of America as represented by the United States Energy Research and Development Administration, Washington, D.C.

[22] Filed: July 16, 1975

[21] Appl. No.: 596,547

[52] U.S. Cl............................ 156/621; 156/DIG. 22; 23/301 R; 23/305 R; 423/491; 423/101
[51] Int. Cl.² ...................... B01D 9/02; B01J 17/04; C01G 13/04
[58] Field of Search................... 423/103, 101, 491; 156/621, DIG. 22; 23/301 R, 305 R

[56] References Cited
UNITED STATES PATENTS

| | | | |
|---|---|---|---|
| 2,914,451 | 11/1959 | Baldoni | 423/491 |
| 3,704,103 | 11/1972 | Barta | 156/610 |

OTHER PUBLICATIONS

Mellor, Comp. Treat. on Inorg. and Theo. Chem., vol. IV, 1923, pp. 901–913.
Ponpon, IEEE Trans. on Nucl. Sci., vol. 1, 15–22, Feb. 1975, pp. 182–191.
Chemical Abstracts, vol. 4, 1910, pp. 2894–2895 (Gernez).
Chem. Abstracts, vol. 70, 1969, p. 345, 62105s, Johansson.
Calorimetric Study of For. of Zn, Cd, $Hg^{+2}$ Halide and Thiocya. Complexes in DMSO and DMF, Gorenbein et al., Uks Khim. ZR. v. 40, No. 9, pp. 923–927, 1974.
Complexing among Zn, Cd, & Hg Iodides in DMF and DMSO, Gorenbein et al., ZR. Obshch. Khim., vol. 43, No. 7, pp. 1440–1444, 1973.
Structure of Hg(II) Iodide Complexes in DMSO & DMF, Sohns, Gaizer et al., Magy. Kem. Foly. (Hung. J. of Chem.), 75, 12, pp. 553–558, 1969.

Primary Examiner—Stephen J. Emery
Attorney, Agent, or Firm—Dean E. Carlson; John A. Koch

[57] ABSTRACT

Dimethylsulfoxide is used as a solvent for the growth of red mercuric iodide ($HgI_2$) crystals for use in radiation detectors. The hygroscopic property of the solvent allows controlled amounts of water to enter into the solvent phase and diminish the large solubility of $HgI_2$ so that the precipitating solid collects as well-defined euhedral crystals which grow into a volume of several cc.

9 Claims, No Drawings

GROWTH OF MERCURIC IODIDE SINGLE CRYSTALS FROM DIMETHYLSULFOXIDE

BACKGROUND OF THE INVENTION

The invention described herein was made in the course of, or under, Contract AT(29-1)-1183, with the U.S. Energy Research and Development Administration (formerly the U.S. Atomic Energy Commission).

This invention relates to processes for growing the red tetragonal polymorph of mercuric iodide, and more particularly to a mercuric iodide growth process which utilizes dimethylsulfoxide as the solvent.

Ever since the appearance of semiconductor detectors, particularly of silicon and germanium types, an inherent drawback has been the low photoelectric efficiency that results from the low atomic numbers of these detector materials and the requirement for cyrogenic cooling. In the search for higher atomic number detector materials, compounds with large energy band gaps such as CdTe and, more recently, in $HgI_2$ have been explored. $HgI_2$, in its stable room-temperature polymorph in particular, promises to be one of the most potentially useful, high atomic number, room-temperature operable radiation detector materials. Large size is an important attribute in some of these applications.

The main difficulties encountered with $HgI_2$ are associated with structural imperfections and high impurity concentrations which lead to problems of carrier trapping and detrapping and of detector fabrication. In efforts to overcome these problems, various prior methods have been developed for producing $HgI_2$ crystals, as exemplified in the articles (and earlier references therein) in: Philips Tech. Rev., 28,316–319 (1967) by H. Scholz; Acta Electronica, 17, 1, 69–73 (1974) by H. Scholz; and Journal of Crystal Growth, 24/25, 205–211 (1974) by M. Schieber, et al. Basically, growth of $HgI_2$ crystals has been accomplished by two techniques: vapor-grown and solution-grown, each of which has certain advantages and disadvantages. The existence of a disruptive phase transformation at 127°C severely limits the application of normal crystal growth techniques from the melt.

SUMMARY OF THE INVENTION

This invention is directed to a solution-growth-type process for $HgI_2$ single crystals in which dimethylsulfoxide is used as a solvent. It has been found that dimethylsulfoxide is a superior solvent for the growth of large, clear, and pure crystals of the low-temperature red polymorph of mercuric iodide. No other single solvent has been found which gives the size or clarity of growth or the controlled nucleation and growth. The $HgI_2$ single crystals made by the process of this invention find current use in nuclear spectroscopy for low-energy gamma radiation and can be utilized in room-temperature x-ray fluorescence detectors and in photoconductive devices, as well as other applications.

Therefore, it is an object of the present invention to provide a process for growing large mercuric iodide crystals.

A further object of the invention is to provide a solution-type mercuric iodide crystal growth process in which dimethylsulfoxide is used as the solvent.

Another object of the invention is to provide a mercuric iodide crystal growth process utilizing a solvent having a hygroscopic property which allows controlled amounts of water to enter into the solvent phase and diminish the large solubility of $HgI_2$ so that the precipitating solid collects as well-defined euhedral single crystals which grow into a volume of several cc.

Other objects of the invention will become readily apparent from the following description and accompanying drawings.

DESCRIPTION OF THE INVENTION

The invention is directed to the growth of red mercuric iodide ($HgI_2$) crystals by a process which utilizes dimethylsulfoxide (DMSO) as the solvent. It has been found that DMSO is a superior solvent for the growth of large, clear, and pure crystals of the low-temperature red polymorph of mercuric iodide. The known hygroscopic property of the DMSO allows controlled amounts of water to enter into the solvent phase and diminish the very large solubility of $HgI_2$ so that the precipitating solid collects as a few well-defined transparent crystals, each of which grows into a volume of several cc. No other single organic solvent has been found to have this characteristic.

DMSO is relatively nontoxic, has a low vapor pressure, is inexpensive and readily available at high purity, readily mixes with polar and nonpolar solvents to provide variation in solvent properties, is stable in the laboratory environment within the range of crystal-growing temperatures (20° to 80°C), and the large solubility (mole ratio $2DMSO/HgI_2$, for example) gives a basis for good crystal growth from solution.

As pointed out above, $HgI_2$ crystals made in accordance with the present invention currently have use in nuclear spectroscopy for low-energy gamma radiation and having possible application for room-temperature x-ray fluorescence detectors and in photoconductive devices, as well as various other applications.

To carry out the solution-type growth process in accordance with the present invention, reagent grade mercuric iodide ($HgI_2$) is dissolved in reagent grade dimethylsulfoxide (DMSO) in the approximate mole ratio of 2DMSO to 1 $HgI_2$, thereby forming a solution. Reagent grade $HgI_2$ and DMSO is herein defined as meeting the American Chemical Society specifications: "Reagent Chemicals," 4th ed., 1968 (ACS, Washington, D.C.).

The thus formed mother liquor or solution, which, for example, may consist of 1 mole of $HgI_2$ and 2 moles of DMSO, is heated (temperature of 25° to 35°C) to ensure complete dissolution and filtered hot to remove extraneous particles. Heating of the solution may be accomplished by water baths, laboratory ovens, or heat lamps. The filter may be constructed, for example, of sintered Pyrex glass. The solution, after filtering, is kept in closed (standard taper joint) chemical vessels (constructed of Pyrex or Vycor) at laboratory temperature (20° to 24°C) for storage, although constant temperatures up to 80°C can be used for extended periods. Growth and nucleation are accomplished by allowing the concentrated solution to come in contact with laboratory air of normal humidity. A constant temperature will increase the perfection of crystal growth. After 0.5 to 24 hours of incubation time (depending on the mole ratio and the laboratory humidity), clear red platelets appear on the bottom of the vessel. For example, with a 2DMSO to 1 $HgI_2$ mole ratio and humidity of 30 percent, the incubation time is four hours. The mole ratio may vary from 3 DMSO — 1 $HgI_2$ to 1.9 DMSO — 1 $HgI_2$ and the humidity from 15 to 50. Higher humidity seems to be detrimental. (After the incubation time, in addition to clear red platelets appearing on the bottom of the vessel, a crystal seed will occasionally appear on the meniscus of the liquid surface of the solution; but, as it gains weight, it falls to the bottom of the vessel and continues growing there. These small crystals (cross section of $2 \times 2 \times 0.2$ mm to $10 \times 10 \times 0.5$ mm with volume of 0.8 mm$^3$ to 50 mm$^3$) can be rescued or removed from the solution at this stage by normal decantation (carried out by dumping the top layer into a compatible solvent); washing the crystals three times with an inert solvent such as an aromatic hydrocarbon, xylene for example, and drying on a paper towel or filter paper; or by judicious use of forceps, washing and drying; or the growth can be continued in the mother solution or liquor so as to produce larger, thicker crystals (cross section of $0.5 \times 0.5 \times 0.1$ cm to $2.5 \times 2.5 \times 1.2$ cm and volume of 0.025 cc to 7.5 cc), a time between 1 to 24 'hours being required to produce these larger crystals. The longer growth periods produce more transparent crystals. These crystals are processed as above.

Physical examination of the crystals shows that the longer ([001]) $c$ axis of the tetragonal unit cell lies perpendicular to the flat surface of the platelets (small crystals), implying that the growth in the plane (along the crystallographic $a$ [100] axis) is dominant initially but that the growth becomes more isotropic and develops facets ([110] faces) in the latter stages, as the larger crystals are grown. These large crystals can be removed or rescued from the solution in the same fashion above described for removing the platelets. The remaining mother liquor or solution can be heated under vacuum (temperature of 25° to 40°C) to remove absorbed water and resaturated with fresh HgI$_2$ (40 to 70 gm per 500 ml batch, for example, to bring up the mole ratio) to continue the batch crystallization operation.

In the above-described process of growing large crystals (which occurs in a few hours), a small amount of heterogeneous nuclei appear which then grow very large. Spurious, dendritic, or twinned growth is practically nonexistent in this system, the size distribution of the final crystals is very narrow, and the process is self-terminating (apparently as the degree of supersaturation decreases below a critical level). Minor variations (18° to 80°C) in growth temperature or in solvent composition (by mixing in a compatible solvent, such as xylene or toluene over ratio variations of 2:1) have little effect on the growth morphology or rate. Preseeding with HgI$_2$ has not been effective in controlled nucleation or in producing larger crystals.

The solubility of HgI$_2$ increases slightly (260 to 340 gm/100 gm solvent) with temperature, and slow cooling (80° to 22°C) of sealed containers can be used as in conventional crystal growth techniques. The additional driving force for crystal growth due to water absorption decreasing the solubility may produce larger crystals.

The thus produced crystals, used as nuclear radiation detectors, would benefit manufacturers of medical electronic equipment, industrial radiography (including equipment to monitor airline luggage), radiation detection and dosimetry, and x-ray fluorescence instrumentation, including scanning electron microscopes.

Seeded crystal growth using DMSO as the solvent may be possible in a conventional rotary crystallizer, or in some other process that provides a continuous source of new nutrient to maintain the necessary supersaturation. Also, if the concentrated solutions of HgI$_2$ in DMSO are stable at 130°C, it might be possible to grow the high-temperature yellow polymorph of HgI$_2$.

The concept of water absorption to decrease solubility should be applicable to many other solute-solvent pairs, but there is no guarantee that growth and nucleation rates will be suitable for crystal growth. Use of high-purity DMSO and HgI$_2$ would probably increase size, perfection, and detector performance.

It has thus been shown that the present invention constitutes a substantial advance in the art of growing HgI$_2$ crystals.

While specific parameters and materials have been described for carrying out the invention, modifications and changes will become apparent to those skilled in the art, and it is intended to cover in the appended claims all such modifications as come within the spirit and scope of the invention.

What I claim is:

1. A process for growing large euhedral tetragonal mercuric iodide single crystals comprising the steps of: forming a solution of mercuric iodide and dimethylsulfoxide, containing the thus formed solution in a vessel at a temperature in the range of about 20° to 80°C and in contact with air of 15 to 50% humidity which allows water to enter into the solution for a time period sufficient to form clear red crystals in the solution, and removing the thus formed crystals from the solution.

2. The process defined in claim 1, wherein the steps of forming the solution are carried out by dissolving mercuric iodide in dimethylsulfoxide, heating and thus formed solution to ensure complete dissolution, and filtering the solution while heated to remove extraneous particles.

3. The process defined in claim 2, wherein the mercuric iodide is dissolved in the dimethylsulfoxide in a mole ratio of about 2 dimethylsulfoxide to 1 mercuric iodide.

4. The process defined in claim 1, wherein the steps of containing the solution are carried out in an open vessel.

5. The process defined in claim 1, wherein the time period sufficient to form the crystals in the solution is in the range of 0.5 to 24 hours, and wherein the thus formed crystals define clear red platelets having a volume of about $8 \times 10^{-4}$ to $5 \times 10^{-2}$ cc.

6. The process defined in claim 1, wherein the time period sufficient to form the single crystals in the solution is in the range of 1 to 24 hours, and wherein the thus formed crystals have a volume of about $2.5 \times 10^{-2}$ to 7.5 cc.

7. The process defined in claim 1, wherein the steps of removing the thus formed crystals from the solution are carried out by decantation, washing with an inert solvent, and drying.

8. The process defined in claim 7, wherein the step of washing with an inert solvent is carried out in an aromatic hydrocarbon.

9. The process defined in claim 1, additionally including the steps of reheating the solution under vacuum after the crystals have been removed therefrom to remove absorbed water, and resaturating the solution with fresh mercuric iodide to reestablish the mole ratio for continued crystallization operation.

* * * * *